United States Patent
Crosby et al.

(10) Patent No.: US 12,155,994 B2
(45) Date of Patent: Nov. 26, 2024

(54) ACOUSTIC RESONATORS FOR MICROPHONES

(71) Applicant: Apple Inc., Cupertino, CA (US)

(72) Inventors: Justin D. Crosby, Cupertino, CA (US); Kevin M. Froese, Madison, WI (US); Tzu Hung Huang, Campbell, CA (US)

(73) Assignee: Apple Inc., Cupertino, CA (US)

( * ) Notice: Subject to any disclaimer, the term of this patent is extended or adjusted under 35 U.S.C. 154(b) by 73 days.

(21) Appl. No.: 17/583,137

(22) Filed: Jan. 24, 2022

(65) Prior Publication Data
US 2023/0239611 A1    Jul. 27, 2023

(51) Int. Cl.
*H04R 1/28* (2006.01)
*H03H 9/17* (2006.01)
*H04M 1/02* (2006.01)
*H04R 1/04* (2006.01)
*H05K 5/00* (2006.01)
*H05K 5/03* (2006.01)

(52) U.S. Cl.
CPC ............ *H04R 1/2876* (2013.01); *H03H 9/17* (2013.01); *H04R 1/04* (2013.01); *H05K 5/0017* (2013.01); *H05K 5/03* (2013.01); *H04M 1/026* (2013.01); *H04R 2499/11* (2013.01); *H04R 2499/15* (2013.01)

(58) Field of Classification Search
CPC .... H04R 1/2876; H04R 1/04; H04R 2499/11; H04R 2499/15; H03H 9/17; H05K 5/0017; H05K 5/03; H04M 1/026; H04M 1/035
See application file for complete search history.

(56) References Cited

U.S. PATENT DOCUMENTS

| | | | | |
|---|---|---|---|---|
| 5,261,006 A | * | 11/1993 | Nieuwendijk | H04R 1/345 381/345 |
| 8,885,867 B1 | * | 11/2014 | Tai | H04R 1/345 381/388 |
| 10,299,032 B2 | * | 5/2019 | Grazian | H04R 1/021 |
| 2004/0203494 A1 | * | 10/2004 | Eaton | H04R 1/2842 381/345 |
| 2011/0170728 A1 | | 7/2011 | Chen | |
| 2012/0106766 A1 | * | 5/2012 | Kuroda | H04M 1/035 381/337 |
| 2012/0257776 A1 | * | 10/2012 | Ozcan | H04R 5/02 381/345 |

(Continued)

FOREIGN PATENT DOCUMENTS

| | | | |
|---|---|---|---|
| JP | WO19911019406 A1 | * 12/1991 | |
| WO | WO-9851122 A1 | * 11/1998 | H04M 1/03 |
| WO | WO-2013064602 A1 | * 5/2013 | G10K 11/172 |

*Primary Examiner* — Carolyn R Edwards
*Assistant Examiner* — Kuassi A Ganmavo
(74) *Attorney, Agent, or Firm* — BAKERHOSTETLER (57) ABSTRACT

Aspects of the subject technology relate to electronic devices having microphones. An electronic device may include a microphone and a resonator for the microphone. The resonator may be formed in a device structure that is spatially separated from the microphone. The resonator may be formed in an interior wall of a housing of the electronic device, or in a support structure within an enclosure of the electronic device. A resonator and/or one or more damping features, may reduce a resonance effect, on the microphone, of a resonant cavity within the enclosure of the electronic device and adjacent the microphone.

25 Claims, 6 Drawing Sheets

(56) References Cited

U.S. PATENT DOCUMENTS

| | | | |
|---|---|---|---|
| 2013/0034255 A1* | 2/2013 | Parker | H04R 1/2857 381/338 |
| 2013/0064390 A1* | 3/2013 | Dinh | H04M 1/035 381/91 |
| 2013/0156245 A1* | 6/2013 | Dix | H04R 1/2873 381/353 |
| 2014/0064542 A1 | 3/2014 | Bright | |
| 2019/0082252 A1 | 3/2019 | Grazian et al. | |
| 2019/0281381 A1 | 9/2019 | Tao et al. | |
| 2020/0100021 A1 | 3/2020 | Pavlov et al. | |
| 2023/0228220 A1 | 7/2023 | Malkus | |

* cited by examiner

ACOUSTIC RESONATORS FOR MICROPHONES

TECHNICAL FIELD

The present description relates generally to aspects of audio transducers for electronic devices, including, for example, acoustic resonators for microphones for electronic devices.

BACKGROUND

Electronic devices such as computers, media players, cellular telephones, wearable devices, and headphones are often provided with speakers for generating audio output from the device and microphones for receiving audio input to the device. However, as devices are implemented in ever smaller form factors, it can be challenging to integrate microphones into electronic devices, particularly in compact devices such as portable electronic devices.

BRIEF DESCRIPTION OF THE DRAWINGS

Certain features of the subject technology are set forth in the appended claims. However, for purpose of explanation, several aspects of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Portable electronic devices such as a mobile phones, portable music players, tablet computers, laptop computers, wearable devices such as smart watches, headphones, earbuds, other wearable devices, and the like often include one or more audio transducers such as a microphone for receiving sound input, or a speaker for generating sound.

However, challenges can arise when constraints for spatial integration with other device components, and/or other constraints compete with audio quality constraints when attempting to implement an audio transducer module (e.g., a microphone or a microphone module) in an electronic device. These challenges can be particularly difficult when attempting to implement a microphone into a compact device such as a portable or a wearable device. For example, resonance effects within a resonant cavity within a housing of an electronic device at or near a microphone within the housing can disrupt or suppress audio inputs to the microphone at one or more resonant frequencies of the resonant cavity. As an example, a resonant cavity can be unintentionally formed when a gap between adjacent housing components of an electronic device becomes closed, such as due to a shift of one housing component toward another housing component, or due to accumulation of debris in the gap.

In accordance with aspects of the subject disclosure, various features are provided that may ameliorate a resonance effect of a resonant cavity within the housing of an electronic device adjacent to a microphone of the electronic device, and thereby improve the performance of the microphone. In one or more implementations, a housing component may be provided with a modified edge to prevent closure of the gap. In one or more implementations, a portion of the resonant cavity may be at least partially filled with a damping material such as: a protrusion or extension on an interior structure of the electronic device, an additive material such as a foam within the cavity, or a thickening of a housing sidewall. In one or more implementations, a resonator, such as a Helmholtz resonator, may be provided in a device structure separate from the microphone. As examples, a Helmholtz resonator can be formed in an internal plastic structure, or in a housing sidewall. As discussed in further detail hereinafter, in some implementations, multiple resonators can be provided in an electronic device, to ameliorate resonances at multiple resonant frequencies and/or multiple modes of a resonant frequency.

Figure 1:
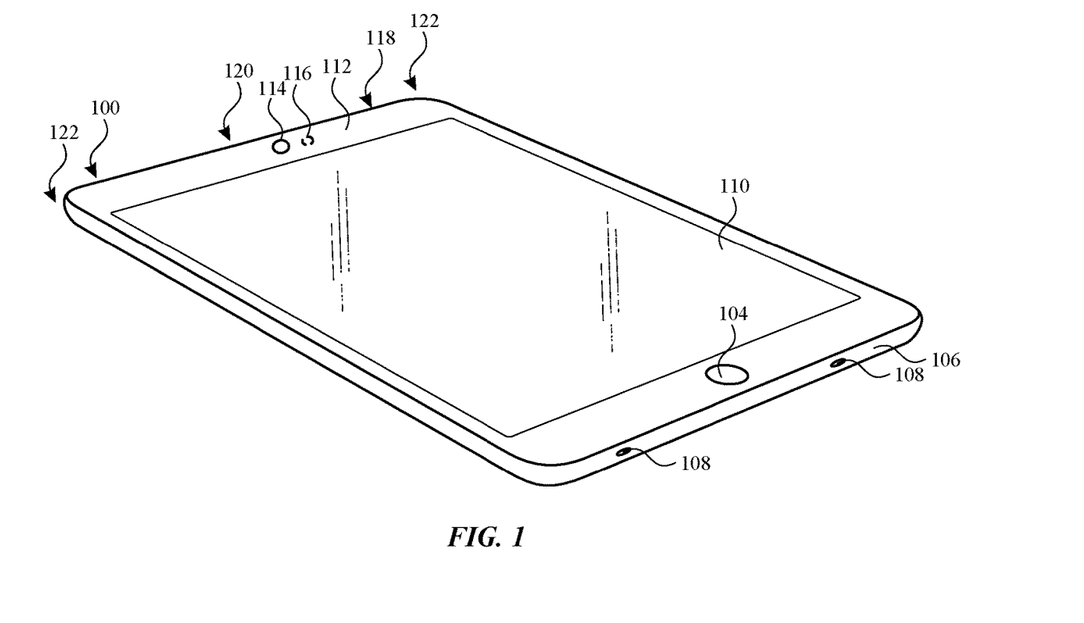
FIG. 1 illustrates a perspective view of an example electronic device having a microphone in accordance with various aspects of the subject technology.

An illustrative electronic device including a microphone is shown in FIG. 1. In the example of FIG. 1, electronic device 100 has been implemented using a housing that is sufficiently small to be portable and carried by a user (e.g., electronic device 100 of FIG. 1 may be a handheld electronic device such as a tablet computer or a cellular telephone or smart phone). As shown in FIG. 1, electronic device 100 includes a display such as display 110 mounted on the front of housing 106. Electronic device 100 includes one or more input/output devices such as a touch screen incorporated into display 110, a button or switch such as button 104 and/or other input output components disposed on or behind display 110 or on or behind other portions of housing 106. Display 110 and/or housing 106 include one or more openings to accommodate button 104, a speaker, a light source, or a camera.

In the example of FIG. 1, housing 106 includes two openings 108 on a bottom sidewall of housing 106. One or more of openings 108 forms a port for an audio component. For example, one of openings 108 may form a speaker port for a speaker disposed within housing 106 and another one of openings 108 may form a microphone port for a microphone disposed within housing 106. Openings 108 may be open ports or may be completely or partially covered with a permeable membrane or a mesh structure that allows air and sound to pass through the openings. Although two openings 108 are shown in FIG. 1, this is merely illustrative. One opening 108, two openings 108, or more than two openings 108 may be provided on the bottom sidewall (as shown) on another sidewall (e.g., a top, left, or right sidewall), on a rear surface of housing 106 and/or a front surface of housing 106 or display 110. In some implementations, one or more groups of openings 108 in housing 106 may be aligned with a single port of an audio component within housing 106. Housing 106, which may sometimes be referred to as a case, may be formed of plastic, glass, ceramics, fiber composites, metal (e.g., stainless steel, aluminum, etc.), other suitable materials, or a combination of any two or more of these materials.

The configuration of electronic device 100 of FIG. 1 is merely illustrative. In other implementations, electronic device 100 may be a computer such as a computer that is integrated into a display such as a computer monitor, a laptop computer, a wearable device such as a smart watch, a pendant device, or other wearable or miniature device, a media player, a gaming device, a navigation device, a computer monitor, a television, a headphone, an earbud, or other electronic equipment.

In some implementations, electronic device 100 may be provided in the form of a wearable device such as a smart watch. In one or more implementations, housing 106 may include one or more interfaces for mechanically coupling housing 106 to a strap or other structure for securing housing 106 to a wearer. Electronic device 100 may include one, two, three, or more than three audio components each mounted adjacent to one or more of openings 108.

In the example of FIG. 1, display 110 includes a transparent outer layer 112 (e.g., a glass layer or a transparent plastic layer) that, along with the housing 106, forms an enclosure for the electronic device 100. As shown, the transparent outer layer 112 may include one or more openings such as opening 114. Opening 114 may form a port for an audio component. For example, opening 114 may form a microphone port for a microphone 116 disposed within the enclosure formed by the housing 106 the transparent outer layer 112. Opening 114 may be an open port or may be completely or partially covered with a permeable membrane and/or a mesh structure that allows air and sound to pass through the opening 114.

In the example of FIG. 1, the microphone 116 is offset from the opening 114. For example, the microphone 116 may be acoustically coupled to the opening 114 via an acoustic duct within the enclosure of electronic device 100 and extending between the opening 114 and the microphone 116. In one or more implementations, the acoustic duct that is configured to allow sound generated externally to the electronic device 100 to reach the microphone 116 may also be acoustically coupled to one or more cavities within the enclosure formed by the housing 106 and the transparent outer layer 112. In one or more implementations, the electronic device 100 may include a gap 118 between the housing 106 and the transparent outer layer 112. For example, the gap 118 may have a gap width of less than one millimeter (mm), less than 0.5 mm, less than 0.2 mm, less than 0.1 mm, or between zero and one hundred microns. As shown in FIG. 1, the enclosure formed by the housing 106 and the transparent outer layer 112 may include a one or more straight portions, such as straight portion 120, and one or more curved portions, such as curved portions 122.

Figure 2:
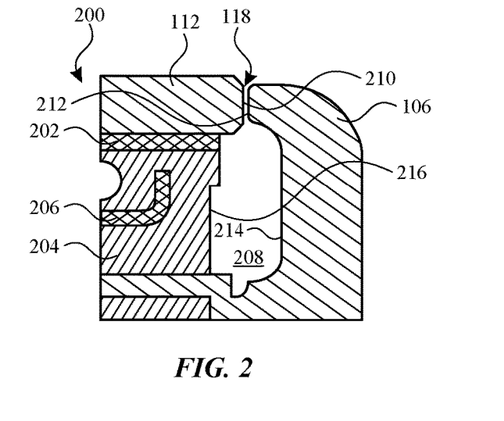
FIG. 2 illustrates a cross-sectional side view of a portion of an example electronic device having a microphone and a cavity that is open to the external environment in accordance with various aspects of the subject technology.

FIG. 2 illustrates a cross-sectional side view of a portion of the electronic device 100 in the vicinity of a cavity within the enclosure formed by the housing 106 and the transparent outer layer 112. As shown in FIG. 2, a cavity 208 within the enclosure formed by the housing 106 and the transparent outer layer 112 may be defined, in part, by a portion (e.g., an interior wall 214) of the housing 106, in part by a portion of the transparent outer layer 112, and in part by internal structures (e.g., a surface 216) of the electronic device 100.

In the example of FIG. 2, the internal structures that define a portion of the cavity 208 include components of a display module 200. As shown, the display module 200 may include the transparent outer layer 112, a display layer 202 (e.g., including display components such as display pixels and/or control circuitry for the display pixels), a support structure 204 (e.g., a molded support structure such as a molded plastic support structure), and a support structure 206 (e.g., a metal support structure). In this example, the support structure 204 is overmolded onto the support structure 206. In other examples, the support structure 204 may be attached to the support structure 206 by other attachment mechanisms or methods (e.g., adhesives, screws, clamps, press fit, etc.). In one or more implementations, the support structure 206 may form portion of a ground plane for the display module, and may also form a part of an antenna system of the electronic device 100, in one or more implementations.

In the example of FIG. 2, the cavity 208 may be defined, in part, by a surface 216 of the support structure 204, and, in part, by an interior wall 214 of the housing 106. In one or more implementations, the cavity 208 may be fluidly and/or acoustically coupled to an acoustic duct between the opening 114 and the microphone 116 of FIG. 2. In the example of FIG. 2, the gap 118 is an air gap between an edge 210 of the transparent outer layer 112, and an edge 212 of the housing 106. In the arrangement shown in FIG. 2, in a use case in which sound that has entered the opening 114 and is travelling through an acoustic duct to the microphone 116 leaks into the cavity 208, the leaked sound can leak back out of the cavity 208 through the gap 118. In this configuration, the operation of the microphone may be unaffected by sound leakage into the cavity 208.

Figure 3:
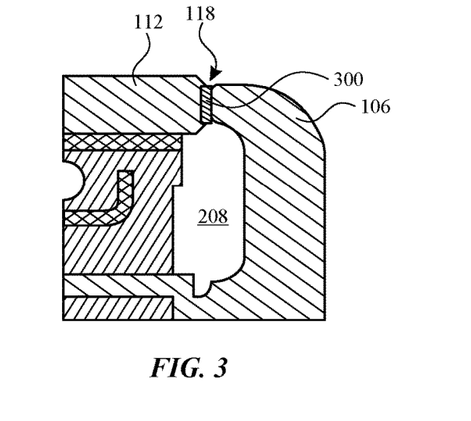
FIG. 3 illustrates a cross-sectional side view of a portion of an example electronic device having a microphone and a closed cavity in accordance with various aspects of the subject technology.

However, as illustrated in FIG. 3, in some implementations, one or more portions of the gap 118 may become closed. For example, in some uses cases, the transparent outer layer 112 and/or the display module 200 may slide (e.g., due to an external pressure or force on the transparent outer layer, a replacement or repair of the display module 200, or in a drop event of the electronic device) toward the edge 212 of the housing 106, moving the edge 210 of the transparent outer layer 112 into contact with the edge 212 of the housing 106. In another example, over time, a material 300, such as debris (e.g., oil, dust, dirt, etc.) from the external environment, may become lodged in the gap 118, thereby closing the gap 118, as in the example of FIG. 3.

In a use case in which the gap 118 becomes closed, the cavity 208 may become a resonant cavity within the housing 106 (e.g., within the enclosure formed by the housing 106 and the transparent outer layer 112). The resonant cavity formed by the closure of a portion of the cavity 208 may have resonant properties that negatively affect the operation of the microphone 116.

Figure 4:
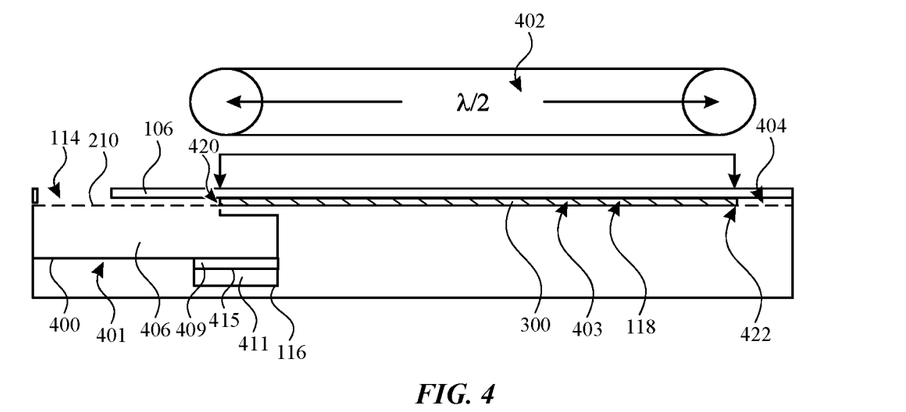
FIG. 4 illustrates a schematic cross-sectional top view of a portion of an electronic device having a microphone and cavity in accordance with various aspects of the subject technology.

For example, FIG. 4 illustrates a top view of a portion of the electronic device 100 including the portion of the electronic device 100 of FIG. 3, in which the material 300 has closed a portion of the gap 118. In this example, the gap 118 includes a closed portion 403 and an open portion 404. In the example of FIG. 3, the closed portion 403 of the gap 118 is caused by the material 300 that has closed the closed portion 403 of the gap 118. However, it is also appreciated that the closed portion 403 of the gap 118 may be formed by a portion of the transparent outer layer 112 that has moved into contact with the housing 106 to close the closed portion 403 of the gap 118. In these examples, the open portion 404 of the gap 118 may be a portion of the gap 118 that has not been filled with material 300 and/or not been closed by contact between the edge 210 of the transparent outer layer 112 and the edge 212 of the housing 106. In this example, a portion of the cavity 208 that is closed by the closed portion 403 of the gap 118 may form a closed cavity (e.g., a trapped and/or resonant cavity) within the housing 106 (e.g., within the enclosure formed by the housing 106 and the transparent outer layer 112). In this example, another portion of the cavity 208 that is open to the external environment via the open portion 404 of the gap 118 may be an open cavity within the housing 106 (e.g., an open cavity that extends from a distal end of the closed cavity).

As shown in the example of FIG. 4, the microphone 116 may include a front volume 409 and a back volume 411. The front volume may be fluidly and acoustically coupled (e.g., via an acoustic duct 406) to the opening 114 in the transparent outer layer 112 (e.g., a cover glass layer or cover glass). In one or more implementations, the acoustic duct 406 may be formed by a microphone housing 400 of a microphone module 401 in which the microphone 116 is disposed. In one or more other implementations, the acoustic duct 406 may be formed, entirely or in part, by one or more other device structures that guide sound that passes through the opening 114 to the microphone 116. In one or more implementations, the cavity 208 may be fluidly and/or acoustically coupled to the acoustic duct 406.

As illustrated in FIG. 4, a closed portion of a cavity within the enclosure of the electronic device 100 (e.g., a closed portion of the cavity 208 of FIG. 3) formed in part by the closed portion 403 of the gap 118 may form a resonant cavity 402 (which is represented externally to the electronic device 100 and enlarged in FIG. 3 for clarity of the discussion, and which may also be referred to herein as a trapped cavity or a standing wave tube in various examples) within the housing 106 (e.g., within the enclosure formed by the housing 106 and the transparent outer layer 112). For example, the size and length of the cavity 208 may allow a standing wave of wavelength, λ, to be generated therein. As indicated in FIG. 4, the wavelength, λ, of the standing wave may be twice the length of the resonant cavity 402. In other words, the resonant cavity 402 may have a length of λ/2. The resonant cavity may also have resonant frequencies of, for example, $f=c/(N*\lambda/2)$, where c is the speed of sound and N is an integer 1,2,3, etc. As discussed in further detail hereinafter, a resonant cavity 402 (e.g., formed by a portion of the cavity 208 that is defined in part by the closed portion 404 of the gap 118 and forms a standing wave tube) may generate a pressure null at the microphone 216 which can cause an undesirable dip in the frequency response of the microphone 116. In one or more implementations, a microphone module 401 mounted within the housing adjacent the opening may include an actuatable sound-generating component 415 (e.g., a diaphragm) that is offset from the opening 114 in the transparent outer layer 112. As illustrated in FIGS. 2-4, in one or more implementations, the resonant cavity 402 may run along an interior wall 214 of the housing 106 in a direction away from the opening 114, from a proximal end 420 adjacent the microphone module 401 to a distal end 422.

In one or more implementations, the distal end 422 of the resonant cavity 402 may be defined by a location at which the gap 118 opens, and sound thus is able to leak out of the cavity 208 into the external environment through the open portion 404 of the gap (e.g., as in the example of FIG. 4). In some examples, the location at which the gap 118 opens may be a location at which no more debris is disposed in the opening. In other examples, the location at which the gap 118 opens may be a location at which the housing 106 and/or the transparent outer layer 112 curve such that the housing 106 and the transparent outer layer 112 curve away from a straight portion 120 of the enclosure in which the housing 106 and the transparent outer layer 112 are in contact. In one or more implementations, the distal end 422 may coincide with the location at which the straight portion 120 interfaces with the curved portion 122.

In one or more implementations, the microphone module 401 may be mounted adjacent a straight portion 120 of the enclosure formed by the housing 106 and the transparent outer layer 112, and the resonant cavity 402 may run along the interior wall 214 to a curved portion 122 of the enclosure formed by the housing 106 and the transparent outer layer 112. In one or implementations, the cavity 208 may include a portion that is an open cavity (e.g., open to the external environment via the open portion 404 of FIG. 4) that runs along the interior wall 214 of the curved portion 122 of the housing 106 and that is fluidly coupled to the resonant cavity 402 (e.g., fluidly coupled to a closed portion of the cavity 208 that is closed, in part, by the closed portion 403 of FIG. 4) at a location within the enclosure and fluidly coupled to an external environment of the electronic device 100 via the gap 118 between the transparent outer layer 112 and the housing 106.

In accordance with aspects of the subject disclosure, an electronic device such as the electronic device 100 may be provided with various features that may reduce or prevent the negative effect on a microphone such as microphone 116, of a resonant cavity that may form within a housing of the electronic device. For example, in one or more implementations, one or more damping features may be provided adjacent to and/or within at least a portion of the cavity, to damp an acoustic resonance of the cavity. In one or more implementations, the electronic device 100 may be provided with one or more structural features that prevent the formation of a resonant cavity within the enclosure thereof. In one or more implementations, one or more additional resonances may be introduced to ameliorate the resonance effect of a resonant cavity on a microphone such as microphone 116.

Figure 5:
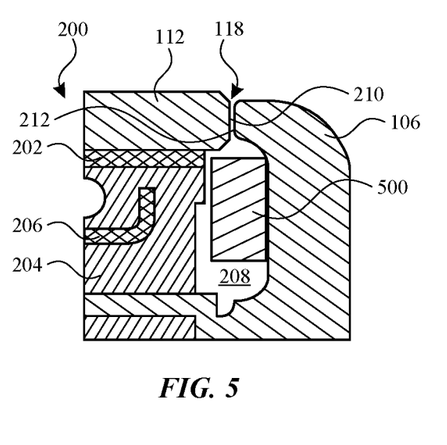
FIG. 5 illustrates a cross-sectional side view of a portion of an example electronic device having a microphone and a cavity that is at least partially filled with a damping material in accordance with various aspects of the subject technology.

For example, FIG. 5 illustrates an exemplary implementation in which the electronic device 100 is provided with a damping feature that includes damping material 500 within at least a portion of the cavity 208. For example, the damping material 500 may be an acoustic foam formed in a portion of the cavity. In one or more implementations, the damping material 500 may reduce a width of the cavity 208 and provide a broad damping of the resonance of the cavity 208 by narrowing the cavity. In one or more implementations, the damping material may be injected into the cavity 208 after the enclosure formed by the housing 106 and the transparent outer layer 112 is assembled.

Figure 6:
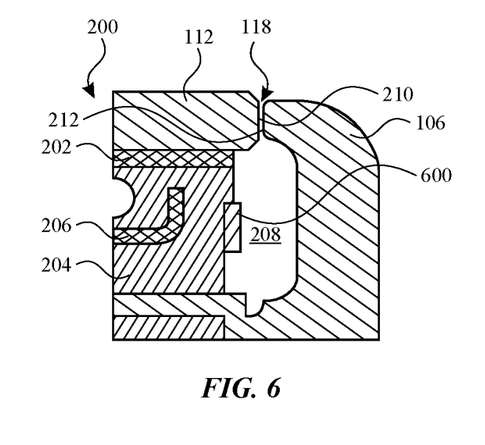
FIG. 6 illustrates a cross-sectional side view of a portion of an example electronic device having a microphone and a cavity that is at least partially filled with another example damping material in accordance with various aspects of the subject technology.

FIG. 6 illustrates another exemplary implementation in which the electronic device 100 is provided with a damping feature that includes damping material 600 within at least a portion of the cavity 208. In the example of FIG. 6, the damping material 600 is formed by an extension member on an interior component (e.g., the support structure 204) of the electronic device 100. In this example, the damping material 600 may be a plastic material that is integrally formed with, or attached to the support structure 204, to form the extension member extending into the cavity 208. In this example, the extension member formed by the damping material 600 narrows the width of the cavity 208 and may provide a broadband damping of the resonant features of the cavity 208.

Figure 7:
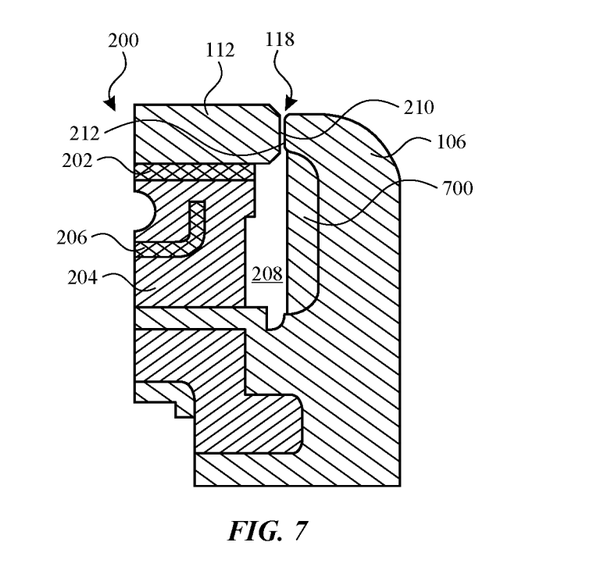
FIG. 7 illustrates a cross-sectional side view of a portion of an example electronic device having a microphone and a cavity that is at least partially filled with yet another example damping material in accordance with various aspects of the subject technology.

FIG. 7 illustrates another exemplary implementation in which the electronic device 100 is provided with a damping feature that includes damping material 700 within at least a portion of the cavity 208. In the example of FIG. 7, the damping material 700 is formed by a thickened portion of the housing 106. In this example, the damping material 700 may be a metal, plastic, glass, or other material that is common to the material of the housing and that is integrally formed with and/or attached to the interior wall 214 of the housing 106. In this example, the thickening of the housing 106 formed by the damping material 700 narrows the width of the cavity 208 and may provide a broadband damping of the resonant features of the cavity 208.

Figure 8:
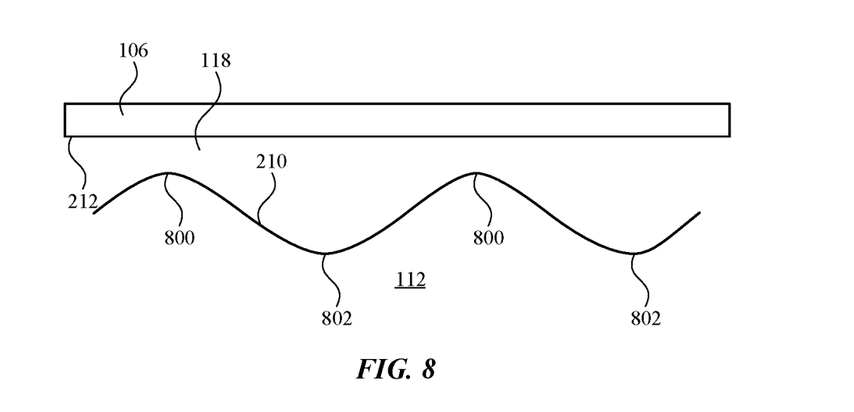
FIG. 8 illustrates a top view of a portion of an electronic device with a structural feature for preventing formation of a resonant cavity in accordance with various aspects of the subject technology.

In one or more implementations, instead of, or in addition to, providing a damping material within the cavity 208, the electronic device 100 may be provided with a structural feature that helps to prevent the gap 118 from closing to form a resonant cavity within the housing 106. For example, FIG. 8 illustrates an example implementation in which the edge 210 of the transparent outer layer 112 is a patterned edge. In the example of FIG. 8, the patterned edge of the transparent outer layer 112 is a curved edge that includes peaks 800 and valleys 802. In this example, if the transparent outer layer 112 is moved (e.g., slides or slips) toward the housing 106, the peaks 800 may contact the edge 212 of the housing 106, leaving a remaining portion of the gap 118 adjacent the valleys 802 to remain open to allow sound to leak from the cavity 208 below (e.g., by keeping cavity 208 fluidly coupled to the external environment of the electronic device 100 via a gap between the valleys 802 and the edge 212 of the housing). In this way, the resonant cavity may be prevented from forming. Although a smoothly curved patterned edge of the transparent outer layer 112 is shown in FIG. 8, it is also appreciated that other patterns can be provided on the edge 210 of the transparent outer layer 112 and/or on the edge 210 of the housing 106, to prevent closing of the gap 118, in various implementations.

In one or more implementations, instead of, or in addition to, providing a damping material within the cavity 208, and/or providing a patterned edge of the transparent outer layer 112 and/or the housing 106 (as in the examples of FIGS. 5-8), the electronic device 100 may include a resonator for the microphone 116. In this way, an additional resonance may be introduced that ameliorates a resonance of a portion of the cavity 208 that may become closed.

Figure 9:
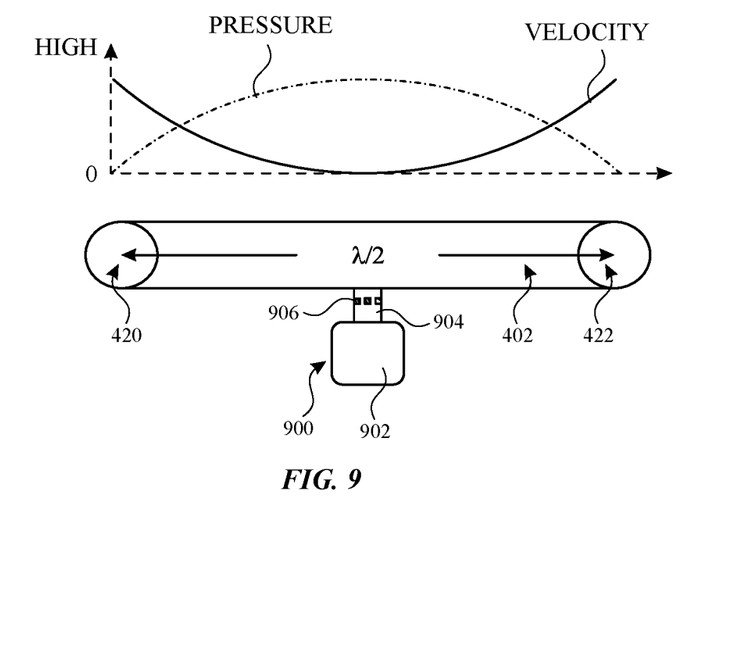
FIG. 9 illustrates a schematic diagram of an example resonator coupled to a cavity of an electronic device for improving the performance of a microphone in accordance with various aspects of the subject technology.

For example, FIG. 9 illustrates an example of a resonator 900 that may be fluidly coupled to the resonant cavity 402 (e.g., and, via the cavity 208, to the front volume 409 of the microphone 116). As illustrated in FIG. 9, the resonant cavity 402 (e.g., formed by a closed portion of the cavity 208) may generate a standing wave having a wavelength, $\lambda$, that is twice a distance between the proximal end 420 and the distal end 422 of the cavity, and the standing wave may cause velocity peaks and pressure nulls at the ends of the resonant cavity 402. In this example, the resonator 900 is configured to modify a resonance of the resonant cavity 402 (e.g., by modifying and/or reducing the standing wave within the cavity) at a target frequency that corresponds to a wavelength of $\lambda/2$, and the resonator 900 is located at a quarter wavelength location of the standing wave (e.g., at a location that is a distance $\lambda/4$ from the proximal end 420). At this location (e.g., a peak pressure location), the pressure generated by standing wave within the resonant cavity 402 may have a maximum pressure, which may be modified and/or reduced by the resonator 900 at that location.

In the example of FIG. 9, the resonator 900 is a Helmholtz resonator having an acoustic compliance portion 902 (e.g., a neck) and an acoustic mass portion 904 (e.g., a chamber) coupled between the acoustic compliance portion 902 and the resonant cavity 402. In the example of FIG. 9, the electronic device 100 also include an acoustic mesh 906 that spans across the acoustic mass portion 904 of the resonator 900. In various implementations, the acoustic mesh 906 may be disposed at one or the other end of the acoustic mass portion 904, or at a location between the ends of the acoustic mass portion 904, and may substantially span the cross-sectional area of acoustic mass portion 904. The acoustic mesh 906 may be a mesh which exhibits loss with respect to velocity, and may be disposed across the acoustic mass portion 904, as velocity is the highest in the acoustic mass of the Helmholtz resonator. In one or more implementations, in addition to, or instead of, the acoustic mesh 906, the resonator 900 may be provided with a damping material in the acoustic compliance portion 902. For example, a damping material in the acoustic compliance portion 902 may provide damping in terms of pressure loss in addition to, or instead of, damping in terms of velocity loss by the acoustic mesh 906 (e.g., as, at the resonance, a peak pressure may occur in the acoustic compliance portion 902 and a peak velocity may occur in the acoustic mass portion 904).

Figure 10:
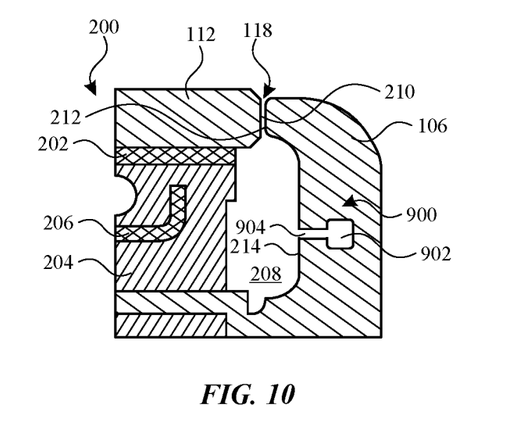
FIG. 10 illustrates a cross-sectional side view of a portion of an example electronic device having a microphone, a cavity, and a resonator for the microphone in a housing of the electronic device in accordance with various aspects of the subject technology.

In one or more implementations, the resonator 900 for the microphone 116 is disposed at a location spatially separated from the microphone 116. For example, the resonator 900 may be formed in the housing 106 or an interior structure (e.g., the support structure 204 of the electronic device 100. For example FIG. 10 illustrates an example in which the resonator 900 is formed in the housing 106 (e.g., in the interior wall 214 of the housing 106). In this example, the resonator 900 (e.g., including the acoustic mass portion 904 and the acoustic compliance portion 902) may be machined directly into, or otherwise formed in, the interior wall 214 of the housing 106. In this example, the resonator 900 may be disposed at a location within the housing 106 that is spatially separated from the microphone module 401. For example, the resonator 900 may be disposed at location (e.g., a peak pressure location, such as a quarter wavelength location) between the proximal end 420 and the distal end 422 of the resonant cavity 402. For example, the peak pressure location or quarter wavelength location may be at a midpoint of the resonant cavity 402 (e.g., midway between the proximal end 420 and the distal end 422). It is also appreciated that, when the electronic device 100 is manufactured, the resonator 900 in the housing 106 may be fluidly coupled to the cavity 208 at a location adjacent an open portion 404 of the gap 118. In this way, the resonator 900 may be positioned in the housing 106 to damp the resonant characteristics of the cavity 208 at a future time when the gap 118, or a portion thereof, becomes closed and/or blocked.

Figure 11:
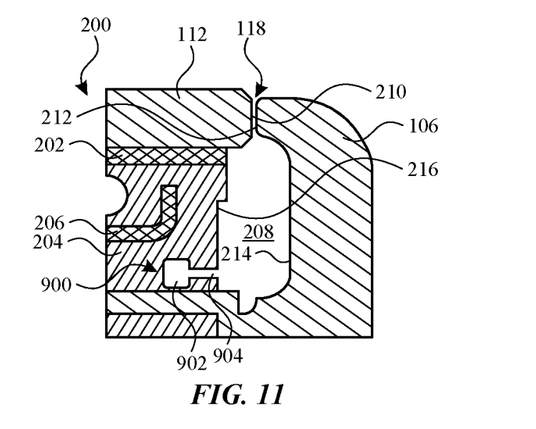
FIG. 11 illustrates a cross-sectional side view of a portion of an example electronic device having a microphone, a cavity, and a resonator for the microphone in an internal structure of the electronic device in accordance with various aspects of the subject technology.

FIG. 11 illustrates another example implementation, in which the resonator 900 is formed in the support structure 204 of the display module 200. In this example, the resonator 900 (e.g., including the acoustic mass portion 904 and the acoustic compliance portion 902) may be formed, for example, by overmolding the support structure 204 on a sacrificial material having the shape of the resonator 900, and removing the sacrificial material to form the resonator 900. In this example, the resonator 900 may be disposed at a location within the support structure 204 that is spatially separated from the microphone module 401. For example, the resonator 900 may be disposed in the support structure 204 at location (e.g., a peak pressure location such as a quarter wavelength location) between the proximal end 420 and the distal end 422 of the resonant cavity 402. It is also appreciated that, when the electronic device 100 is manufactured, the resonator 900 in the support structure 204 may be fluidly coupled to the cavity 208 at a location adjacent an open portion 404 of the gap 118. In this way, the resonator 900 may be positioned in the support structure 204 at the time of manufacturing to damp the resonant characteristics of the cavity 208 at a future time when the gap 118, or a portion thereof, becomes closed and/or blocked.

As discussed herein in connection with various examples, in some use cases, a closure of a portion of the gap 118 that creates a resonant cavity portion of the cavity 208 can occur due to device-to-device manufacturing variations, or (after manufacturing) due to an accidental drop of the electronic device 100, an external pressure or force on the electronic device 100, a replacement or repair of a component such as display module 200 or a portion thereof, and/or due to buildup of debris in the gap 118 over time. For this reason, the length of a resonant cavity within an electronic device such as electronic device 100 may differ from device to device, and/or may change over time. For this reason, the length and/or resonant characteristics of the resonant cavity portion of cavity 208 at any given time, may be unknown at the time of manufacture of the electronic device. In one or more implementations, an electronic device such as the electronic device 100 may include multiple resonators for the microphone 116. For example, the multiple resonators may be sized and arranged to provide targeted modification and/or reduction of standing waves of various wavelengths/frequencies (e.g., in resonant cavities having various respective lengths).

Figure 12:
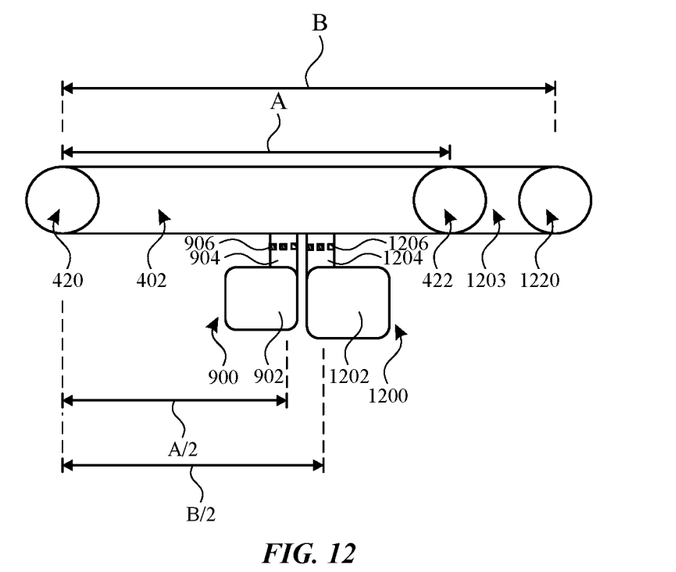
FIG. 12 illustrates a schematic diagram of multiple resonators coupled to a cavity of an electronic device for improving the performance of a microphone at multiple frequencies in accordance with various aspects of the subject technology.

For example, FIG. 12 illustrates an example in which the electronic device 100 includes the resonator 900 configured to modify and/or reduce the resonant characteristics of the resonant cavity 402, and an additional resonator 1200 configured to modify and/or reduce the resonant characteristics of a relatively longer resonant cavity, such as resonant cavity 1203. For example, in one illustrative use case, the resonant cavity 402 may be formed when a portion of the transparent outer layer 112 slides into contact with a portion of the housing 106 and closes a corresponding portion of the gap 118, the portion having a length that defines the length of the resonant cavity 402. In this example use case, over time, another portion of the gap 118 that was not closed when the portion of the transparent outer layer 112 slid into contact with the portion of the housing 106 may become closed (e.g., by becoming filled with debris or due to a further sliding of the transparent outer layer 112), thereby elongating the resonant cavity (e.g., the closed portion of the cavity 208) to form the resonant cavity 1203. For example, the resonant cavity 1203 may be formed by extending the distal end of a closed portion of the cavity 208 to the distal end 1220 of the resonant cavity 1203.

As shown, the resonant cavity 402 that is defined at least in part by the device housing and that extends from the proximal end 420 (adjacent the microphone 116) to the distal end 422 (spatially separated from the microphone 116) may have the resonator 900 fluidly coupled thereto, at a quarter wavelength location of the resonant cavity 402 (e.g., at a midpoint of the resonant cavity 402, such as at a distance A/2 from the proximal end 420 of a resonant cavity having a length A, which may be half of the wavelength λ of a standing wave in the resonant cavity 402). As shown, the resonant cavity 402 extends from the proximal end 420, past the resonator 900, to the distal end 422. However, if the resonant cavity 402 is extended to form the resonant cavity 1203 (e.g., having a length B), the resonator 900 may no longer be effective to modify and/or reduce the resonant characteristics of the cavity. However, in this example use case, resonator 1200 for the microphone 116 may be disposed at an additional location between the location of the resonator 900 and the distal end of the cavity. Because the resonant cavity 1203 is longer than the resonant cavity 402, the resonant cavity 1203 may generate standing waves (e.g., having a wavelength 2B) that is longer than the wavelength λ (e.g., 2A) of the standing waves of the resonant cavity 402. As shown in FIG. 12, the resonator 1200 may be located at a quarter wavelength location of a standing wave in the resonant cavity 1203 (e.g., at a midpoint of the resonant cavity 1203 such as at a distance B/2 from the proximal end 420). As shown, the resonator 1200 may also be a Helmholtz resonator, and may include an acoustic mass portion 1204 and an acoustic compliance portion 1202. As shown, the resonator 1200 may also include an acoustic mesh 1206 disposed across the acoustic mass portion 1204 within or at an end of the acoustic mass portion 1204. The resonator 1200 may also, or alternatively, include a damping material in the acoustic compliance portion 1202 in one or more implementations.

As shown in FIG. 12, the resonator 1200 may have an acoustic compliance portion 1202 (e.g., a chamber) and an acoustic mass portion 1204 (e.g., a neck) that extends from the resonant cavity 1203 to the acoustic compliance portion 1202. As shown, in addition to being disposed further from the microphone module 401 (e.g., at the proximal end 420), the acoustic mass portion 1204 of the resonator 900 may be relatively longer than the acoustic mass portion 904 of the resonator 900, and the acoustic compliance portion 1202 of the resonator 1200 may be relatively larger in volume than the volume of the acoustic compliance portion 902 of the resonator 900 (e.g., to tune the resonator 1200 to the wavelength 2B of the resonant cavity 1203). As shown in FIG. 12, the resonator 1200 may be provided with an acoustic mesh 1206 that spans the acoustic mass portion 1204. In various implementations, the acoustic mesh 1206 may be disposed across the acoustic mass portion 1204 at the end of the acoustic mass portion 1204 that interfaces with the resonant cavity 1203, at an opposing end of the acoustic mass portion 1204 that interfaces with the acoustic compliance portion 1202, or at an intermediate location between the ends of the acoustic mass portion 1204.

In the example of FIG. 12, the electronic device 100 is provided with two resonators (resonator 900 and resonator 1200) to modify and/or reduce the resonant characteristics of two resonant cavities with different lengths. In other implementations, more than two resonators can be disposed along the cavity 208 to provide modification and/or reduction of resonance effects for resonant cavities of more than two different lengths, and/or or two or more resonators can be disposed along the cavity to provide damping for multiple modes (e.g., N=1, 2, 3, etc.) of a single resonant cavity.

Figure 13:
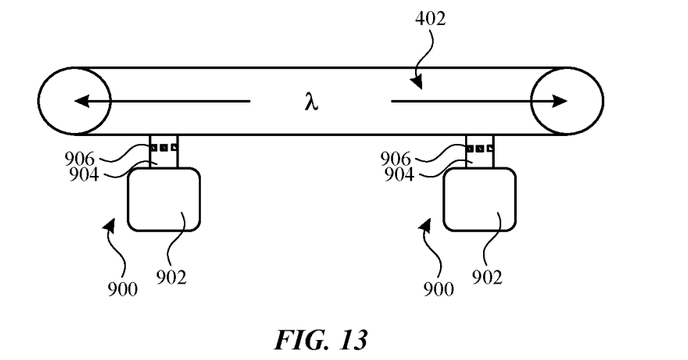
FIG. 13 illustrates a schematic diagram of multiple resonators coupled to a cavity of an electronic device for providing improving the performance of a microphone at multiple modes of standing wave in accordance with various aspects of the subject technology.

For example, FIG. 13 illustrates an example in which two resonators 900 are coupled to the resonant cavity 402 to modify and/or reduce the effects of multiple modes of a standing wave having the wavelength λ. In the example of FIG. 13, the electronic device 100 includes the resonator 900 at a first peak pressure location at the quarter-wavelength position at which the pressure in the resonant cavity 402 peaks, and an additional resonator 900 for the microphone at an additional peak pressure location between the location of the resonator and the distal end of the resonant cavity 402 (e.g., at a location at which the pressure in the resonant cavity 402 is a maximum negative pressure). For example, the resonator 900 nearest the proximal end 420 may be configured to modify a resonance of a first mode of the standing wave having the wavelength λ, and the resonator 900 may be located at a quarter wavelength location of the standing wave (e.g., at a distance of one quarter of the wavelength λ from the proximal end 420). In the example of FIG. 13, the electronic device 100 also includes a second resonator 900 at a three-quarter wavelength location of standing wave having the wavelength λ (e.g., at a distance of three-quarters of wavelength λ from the proximal end 420). In one or more implementations, the resonator 900 at the three-quarter wavelength location may be disposed (e.g., within an interior component such as the support structure 204, or in the housing 106) in the curved portion 122 of the enclosure of the electronic device 100.

Figure 14:
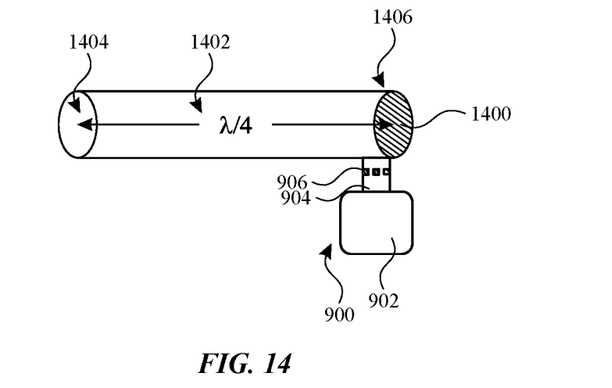
FIG. 14 illustrates a schematic diagram of a resonator coupled to a blocked cavity of an electronic device for providing improving the performance of a microphone in accordance with various aspects of the subject technology.

In the examples of FIGS. 4-13, the resonant cavity 402 (e.g., and the resonant cavity 1203) may have a length that is defined by a location along the cavity 208 at which a closed portion 403 of the gap 118 ends, and beyond which the gap 118 is open. In one or more other examples, the length of a resonant cavity formed by the cavity 208 may be defined by a barrier (e.g., a physical barrier) at the distal end of the cavity. For example, FIG. 14 illustrates an example in which a resonant cavity 1402 (e.g., formed by a portion of the cavity 208 along which the gap 118 is closed) extends from a proximal end 1404 (e.g., adjacent the microphone 116) to a barrier 1400 (e.g., a physical barrier such as a wall) at a distal end 1406. In this example, barrier 1400 closes the resonant cavity 1402 at the distal end 1406. In this example, the resonator 900 is configured to modify a resonance of a standing wave having a wavelength, λ, that is four times a distance between the proximal end 1404 and the distal end 1406 of the resonant cavity 1402. In this example, resonator 900 is located, adjacent the barrier 1400, at a quarter wavelength location of the standing wave (e.g., at a distance of one quarter of the wavelength λ from the proximal end 1404).

In accordance with one or more implementations, a device such as the electronic device 100 may include a microphone 116, having a front volume 409 and a back volume 411, and a resonator 900 for the microphone 116, the resonator 900 fluidly coupled to the front volume 409 of the microphone 116 (e.g., as described herein in connection with FIG. 4). As described herein, in one or more implementations, the resonator 900 may be a Helmholtz resonator (e.g., a Helmholtz resonator that includes a neck, such as the acoustic mass portion 904, and a chamber, such as the acoustic compliance portion 902). As discussed herein, the electronic device 100 may also include an acoustic mesh 906 that spans a neck (e.g., the acoustic mass portion 904) of the Helmholtz resonator. In one or more implementations, the electronic device 100 may include a cavity (e.g., cavity 208 and/or a resonant cavity 402 formed from a portion of the cavity 208) defined at least in part by a device housing (e.g., housing 106) of the electronic device 100, the cavity 208 extending from a proximal end 420 adjacent the microphone 116 to a distal end 422 spatially separated from the microphone 116. The resonator 900 may be fluidly coupled to the cavity. In one or more implementations, the electronic device 100 may also include a device enclosure (e.g., formed, at least in part, by the housing 106 and the transparent outer layer 112) having an opening 114 for the microphone 116. The microphone 116 may include a diaphragm (e.g., the actuatable sound-generating component 415) that is laterally offset from the opening 114 in the device enclosure (e.g., as shown in FIG. 4).

In accordance with one or more implementations, a device such as the electronic device 100 may include a device enclosure (e.g., formed, at least in part, by the housing 106 and the transparent outer layer 112), an acoustic component (e.g., microphone 116) disposed within the device housing, and a resonator 900 for the acoustic component, the resonator formed in the device housing at a location that is spatially separated from the acoustic component. For example, the acoustic component may include a microphone 116 configured to receive sound through an opening 114 in the device enclosure from an external environment of the device. In one or more implementations described herein, the electronic device may also include a cavity (e.g., cavity 208 and/or a resonant cavity 402 formed by a portion of the cavity 208) defined at least in part by the device enclosure and extending from a proximal end 420 adjacent the microphone 116 to a distal end 422 spatially separated from the microphone 116, the resonator 900 being fluidly coupled to the cavity. As discussed in connection with various examples herein (e.g., in connection with FIGS. 4, 9, 12, and/or 13), the cavity may extend from the proximal end 420, past the resonator 900, to the distal end 422. As discussed in connection with, for example, FIG. 4, the cavity may be a closed cavity, and the electronic device 100 may also include an open cavity extending from distal end 422 of the closed cavity, the open cavity fluidly coupled (e.g., via an open portion 404 of the gap 118) to an external environment of the electronic device. As discussed herein in connection with, for example, FIG. 12, the electronic device 100 may also include an additional resonator 1200 formed in the device housing (e.g., in the housing 106) adjacent the location of the resonator 900, in one or more implementations. As discussed herein in connection with, for example, FIG. 14, the electronic device 100 may also include a barrier 1400 at a distal end 1406 of the cavity, and the location of the resonator 900 may be adjacent the barrier 1400.

In accordance with one or more implementations, a device such as the electronic device 100 may include an enclosure (e.g., formed, at least in part, by the housing 106 and the transparent outer layer 112) having an opening 114, a microphone module 401 mounted within the enclosure adjacent the opening 114, the microphone module 401 having an actuatable sound-generating component 415 (e.g., a diaphragm) that is offset from the opening 114 in the enclosure, and a cavity 208 that runs along an interior wall 214 of the enclosure in a direction away from the opening 114, from a proximal end 420 adjacent the microphone module 401 to a distal end (e.g., the distal end 422 or another distal end such as a distal end coinciding with a physical barrier) within the enclosure, and a resonator 900 for the microphone module 401, the resonator 900 formed in a structure (e.g., the support structure 204 as in the example of FIG. 11 or in the housing 106 as in the example of FIG. 10) of the electronic device at a location between the proximal end 420 and the distal end 422 of the cavity, the location spatially separated from the microphone module 401. In one or more implementations, the cavity is at least partially defined by a glass housing member (e.g., the transparent outer layer 112) having an edge 210 adjacent the a housing 106 of the enclosure. In one or more implementations, the cavity 208 includes a first portion that is closed by the housing 106 and the glass housing member and that extends from the microphone module 401 along the interior wall 214 of the housing 106, and a second portion extending from the first portion and fluidly coupled to an external environment of the electronic device by a gap 118 between the housing 106 and the glass housing member. In one or more implementations, the enclosure includes a straight portion 120 and a curved portion 122, the first portion of the cavity 208 extends along the straight portion 120 of the enclosure, and the second portion of the cavity extends along the curved portion 122 of the enclosure. In one more implementations, the structure of the electronic device 100 in which the resonator 900 is formed includes a portion of the housing 106 (e.g., as in the example of FIG. 10). In one or more other implementations, the electronic device 100 includes a display module 200 that includes a cover glass layer (e.g., the transparent outer layer 112) that defines a portion of the cavity, and a support structure 204, and the structure of the electronic device 100 in which the resonator 900 is formed includes a portion of the support structure 204 of the display module 200 (e.g., as in the example of FIG. 11).

Figure 15:
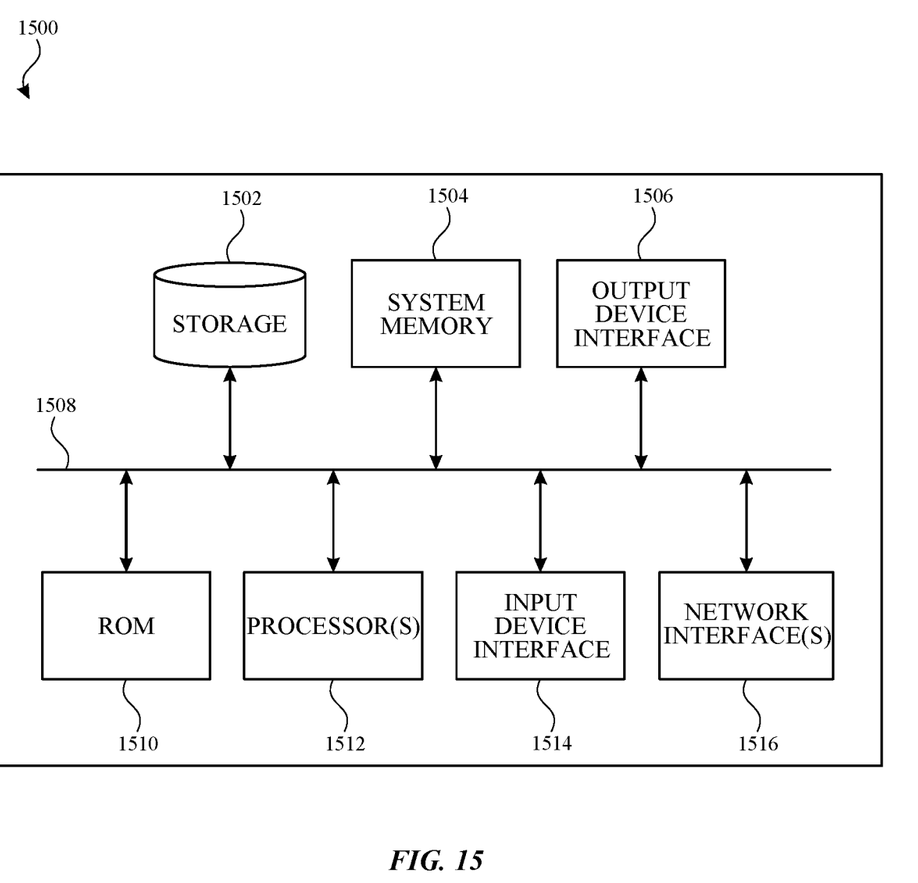
FIG. 15 illustrates an electronic system with which one or more implementations of the subject technology may be implemented.

FIG. 15 illustrates an electronic system 1500 with which one or more implementations of the subject technology may be implemented. The electronic system 1500 can be, and/or can be a part of, one or more of the electronic device 100 shown in FIG. 1. The electronic system 1500 may include various types of computer readable media and interfaces for various other types of computer readable media. The electronic system 1500 includes a bus 1508, one or more processing unit(s) 1512, a system memory 1504 (and/or buffer), a ROM 1510, a permanent storage device 1502, an input device interface 1514, an output device interface 1506, and one or more network interfaces 1516, or subsets and variations thereof.

The bus 1508 collectively represents all system, peripheral, and chipset buses that communicatively connect the numerous internal devices of the electronic system 1500. In one or more implementations, the bus 1508 communicatively connects the one or more processing unit(s) 1512 with the ROM 1510, the system memory 1504, and the permanent storage device 1502. From these various memory units, the one or more processing unit(s) 1512 retrieves instructions to execute and data to process in order to execute the processes of the subject disclosure. The one or more processing unit(s) 1512 can be a single processor or a multi-core processor in different implementations.

The ROM 1510 stores static data and instructions that are needed by the one or more processing unit(s) 1512 and other modules of the electronic system 1500. The permanent storage device 1502, on the other hand, may be a read-and-write memory device. The permanent storage device 1502 may be a non-volatile memory unit that stores instructions and data even when the electronic system 1500 is off. In one or more implementations, a mass-storage device (such as a magnetic or optical disk and its corresponding disk drive) may be used as the permanent storage device 1502.

In one or more implementations, a removable storage device (such as a floppy disk, flash drive, and its corresponding disk drive) may be used as the permanent storage device 1502. Like the permanent storage device 1502, the system memory 1504 may be a read-and-write memory device. However, unlike the permanent storage device 1502, the system memory 1504 may be a volatile read-and-write memory, such as random access memory. The system memory 1504 may store any of the instructions and data that one or more processing unit(s) 1512 may need at runtime. In one or more implementations, the processes of the subject disclosure are stored in the system memory 1504, the permanent storage device 1502, and/or the ROM 1510. From these various memory units, the one or more processing unit(s) 1512 retrieves instructions to execute and data to process in order to execute the processes of one or more implementations.

The bus 1508 also connects to the input and output device interfaces 1514 and 1506. The input device interface 1514 enables a user to communicate information and select commands to the electronic system 1500. Input devices that may be used with the input device interface 1514 may include, for example, microphones, alphanumeric keyboards and pointing devices (also called "cursor control devices"). The output device interface 1506 may enable, for example, the display of images generated by electronic system 1500. Output devices that may be used with the output device interface 1506 may include, for example, printers and display devices, such as a liquid crystal display (LCD), a light emitting diode (LED) display, an organic light emitting diode (OLED) display, a flexible display, a flat panel display, a solid state display, a projector, a speaker or speaker module, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 15, the bus 1508 also couples the electronic system 1500 to one or more networks and/or to one or more network nodes through the one or more network interface(s) 1516. In this manner, the electronic system 1500 can be a part of a network of computers (such as a LAN, a wide area network ("WAN"), or an Intranet, or a network of networks, such as the Internet. Any or all components of the electronic system 1500 can be used in conjunction with the subject disclosure.

In accordance with some aspects of the subject disclosure, a device is provided that includes a microphone having a front volume and a back volume; and a resonator for the microphone, the resonator fluidly coupled to the front volume of the microphone.

In accordance with other aspects of the subject disclosure, a device is provided that includes a device enclosure; an acoustic component disposed within the device enclosure; and a resonator for the acoustic component, the resonator formed in a housing of the device enclosure at a location that is spatially separated from the acoustic component.

In accordance with other aspects of the subject disclosure, an electronic device is provided that includes an enclosure having an opening; a microphone module mounted within the enclosure adjacent the opening, the microphone module having an actuatable sound-generating component that is offset from the opening in the enclosure; a cavity that runs along an interior wall of the enclosure in a direction away from the opening from a proximal end adjacent the microphone module to a distal end within the enclosure; and a resonator for the microphone module, the resonator formed in a structure of the electronic device at a location between the proximal end and the distal end of the cavity, the location spatially separated from the microphone module.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM, and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG, and Millipede memory.

Further, the computer-readable storage medium can include any non-semiconductor memory, such as optical disk storage, magnetic disk storage, magnetic tape, other magnetic storage devices, or any other medium capable of storing one or more instructions. In one or more implementations, the tangible computer-readable storage medium can be directly coupled to a computing device, while in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence, and organization of instructions can vary significantly without varying the underlying logic, function, processing, and output.

While the above discussion primarily refers to microprocessor or multi-core processors that execute software, one or more implementations are performed by one or more integrated circuits, such as ASICs or FPGAs. In one or more implementations, such integrated circuits execute instructions that are stored on the circuit itself.

Various functions described above can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For the purposes of the specification, the terms "display" or "displaying" means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Some of the blocks may be performed simultaneously. For example, in certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or design.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A device, comprising:
   a microphone having a front volume and a back volume;

a cavity extending from a proximal end adjacent the microphone to a distal end interior to the device housing; and a resonator for the microphone, the resonator fluidly coupled to the front volume of the microphone and located at a location that is based on a peak pressure location of a standing wave having a wavelength that is based on a distance between the proximal end and the distal end of the cavity, wherein:

the wavelength is at least twice the distance between the proximal end and the distal end of the cavity, and the peak pressure location is at least one quarter of the wavelength away from the proximal end of the cavity.

2. The device of claim 1, further comprising an acoustic mesh that spans a neck of the resonator.

3. The device of claim 1, wherein location is spatially separated from the microphone.

4. The device of claim 3, wherein the cavity is defined at least in part by a device housing of the device, wherein the distal end is spatially separated from the microphone, and wherein the resonator is fluidly coupled to the cavity.

5. The device of claim 4, wherein the resonator is formed in the device housing or an interior structure of the device.

6. The device of claim 1, further comprising a device enclosure having an opening for the microphone, wherein the microphone includes a diaphragm that is laterally offset from the opening in the device enclosure.

7. A device, comprising:
a device enclosure;
a microphone disposed within the device enclosure;
a cavity extending from a proximal end adjacent the microphone to a distal end interior to the device enclosure;
a first resonator for the microphone, the first resonator formed in the device enclosure at a location along the cavity that is spatially separated from the microphone and that is based on a first peak pressure location of a standing wave having a wavelength that is based on a distance between the proximal end and the distal end of the cavity; and
a second resonator at a second peak pressure location of the standing wave, wherein the second peak pressure location is at least three-quarters of the wavelength away from the proximal end of the cavity.

8. The device of claim 7, wherein the microphone is configured to receive sound through an opening in the device enclosure from an external environment of the device.

9. The device of claim 8, wherein the cavity is defined at least in part by the device enclosure, wherein the distal end is spatially separated from the microphone, and wherein the first resonator is fluidly coupled to the cavity.

10. The device of claim 9, wherein the cavity extends from the proximal end, past the first resonator, to the distal end.

11. The device of claim 10, wherein the cavity comprises a closed cavity, and wherein the device further comprises an open cavity extending from the distal end of the closed cavity, the open cavity fluidly coupled to the external environment of the device.

12. The device of claim 10, further comprising an additional resonator for the microphone at an additional location between the location of the resonator and the distal end of the cavity.

13. The device of claim 12, wherein the additional resonator is formed in the device housing adjacent the location of the resonator.

14. The device of claim 9, further comprising a barrier at the distal end of the cavity, wherein the location of the first resonator is adjacent the barrier.

15. The device of claim 8, wherein the first resonator comprises a Helmholtz resonator having an acoustic mass portion and an acoustic compliance portion.

16. The device of claim 15, further comprising at least one of: an acoustic mesh that spans across the acoustic mass portion or a damping material in the acoustic compliance portion.

17. An electronic device, comprising:
an enclosure having an opening;
a microphone module mounted within the enclosure adjacent the opening, the microphone module having an actuatable sound-generating component that is offset from the opening in the enclosure;
a cavity that runs along an interior wall of the enclosure in a direction away from the opening from a proximal end adjacent the microphone module to a distal end within the enclosure;
a resonator for the microphone module, the resonator formed in a structure of the electronic device at a location between the proximal end and the distal end of the cavity, the location spatially separated from the microphone module,
wherein the resonator is located at a location that is based on a peak pressure location of a standing wave having a wavelength that is based on a distance between the proximal end and the distal end of the cavity; and
a barrier that closes the cavity at the distal end, wherein the wavelength is at least four times a distance between the proximal end and the distal end of the cavity, and the resonator is located at a distance of at least one quarter of the wavelength from the proximal end of the cavity.

18. The electronic device of claim 17, wherein the resonator comprises a Helmholtz resonator having an acoustic compliance portion and an acoustic mass portion coupled between the acoustic compliance portion and the cavity, the electronic device further comprising an acoustic mesh over or within the acoustic mass portion.

19. The electronic device of claim 17, wherein the enclosure includes a housing and a glass housing member having an edge adjacent the housing, and wherein the cavity is at least partially defined by the glass housing member.

20. The electronic device of claim 19, wherein the cavity includes a first portion that is closed by the housing and the glass housing member and that extends from the microphone module along the interior wall, and a second portion extending from the first portion and fluidly coupled to an external environment of the electronic device by a gap between the housing and the glass housing member.

21. The electronic device of claim 20, wherein the enclosure comprises a straight portion and a curved portion, wherein the first portion of the cavity extends along the straight portion of the enclosure, and wherein the second portion of the cavity extends along the curved portion of the enclosure.

22. The electronic device of claim 19, wherein the wavelength is twice the distance between the proximal end and the distal end of the cavity, and wherein the peak pressure location is one quarter of the wavelength away from the proximal end of the cavity.

23. The electronic device of claim 22, further comprising a second resonator at an additional peak pressure location of the standing wave, wherein the additional peak pressure location is three-quarters of the wavelength away from the proximal end of the cavity.

24. The electronic device of claim 17, wherein the structure of the electronic device comprises a portion of a housing of the enclosure.

25. The electronic device of claim 17, further comprising a display module that includes:
    a cover glass layer that defines a portion of the cavity; and
    a support structure, wherein the structure of the electronic device comprises a portion of the support structure of the display module.

\* \* \* \* \*